US009590286B2

(12) United States Patent
Park

(10) Patent No.: US 9,590,286 B2
(45) Date of Patent: Mar. 7, 2017

(54) PRINTED DIPLEXER

(71) Applicant: LG INNOTEK CO., LTD., Seoul (KR)

(72) Inventor: Young Hun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/806,822

(22) Filed: Jul. 23, 2015

(65) Prior Publication Data

US 2016/0036409 A1 Feb. 4, 2016

(30) Foreign Application Priority Data

Aug. 4, 2014 (KR) ........................ 10-2014-0099584

(51) Int. Cl.
*H03H 7/46* (2006.01)
*H01P 1/213* (2006.01)

(52) U.S. Cl.
CPC .................................... *H01P 1/213* (2013.01)

(58) Field of Classification Search
CPC .......... H03H 7/46; H03H 7/463; H01P 1/213; H01P 1/2135
USPC .......................................... 333/126–129, 132
See application file for complete search history.

(56) References Cited

U.S. PATENT DOCUMENTS 3,646,478 A * 2/1972 Ross ...................... H03F 3/602
307/106

* cited by examiner

*Primary Examiner* — Robert Pascal
*Assistant Examiner* — Kimberly Glenn
(74) *Attorney, Agent, or Firm* — LRK Patent Law Firm

(57) ABSTRACT

A printed diplexer is printed on a PCB, having at least two input terminals respectively connected to at least two end portions thereof, having the output terminal connected at a center portion thereof, and configured to output a signal inputted from the at least two input terminals to the output terminal.

4 Claims, 6 Drawing Sheets

PRINTED DIPLEXER

CROSS-REFERENCE TO RELATED APPLICATIONS

The present application is based on, and claims priority from the Korean Patent Application Number 10-2014-0099584, filed on Aug. 4, 2014, the disclosure of which is incorporated by reference herein in its entirety.

BACKGROUND

1. Field of the Disclosure

The present disclosure relates to a printed diplexer.

2. Discussion of the Related Art

Generally, a diplexer is referred to as a device configured to deliver signals separately outputted from at least two circuits to a single circuit without influencing each other.

The conventional diplexer is implemented as a single chip element where a circuit is printed on a dielectric material. Such chip is mounted by SMT (Surface Mounting Technology) on a PCB (Printed Circuit Board). The higher a dielectric permittivity of the chip is, the smaller the diplexer can be miniaturized and sold at higher price.

Even though the higher dielectric permittivity can allow implementation of the smaller diplexer, however, due to insertion loss endemic in the dielectric materials, the higher dielectric permittivity causes the more insertion loss and the narrower band-pass filter characteristic. Therefore, there is a problem in that it is very difficult to miniaturize the diplexer smaller than a certain size. In addition, there is still a problem in that it is impossible to handle various frequencies because the conventional diplexer can diplex only a fixed frequency.

SUMMARY OF THE DISCLOSURE

The technical challenge which the present disclosure intends to achieve is, to provide a printed diplexer capable of handling various frequencies and having competitive price, by directly printing the diplexer on a PCB.

In a general aspect of the present disclosure, there is provided a printed diplexer, the printed diplexer comprising: at least two input terminals mounted on a PCB (Printed Circuit Board); an output terminal mounted on the PCB, and a main body, printed on the PCB, having the at least two input terminals respectively connected to at least two end portions thereof, having the output terminal connected at a center portion thereof, and configured to output a signal inputted from the at least two input terminals to the output terminal.

In some exemplary embodiments of the present disclosure, the input terminal may be an inductor.

In some exemplary embodiments of the present disclosure, an inductance of the inductor may be determined by frequency of a signal inputted through the input terminal.

In some exemplary embodiments of the present disclosure, the output terminal may be a capacitor.

In some exemplary embodiments of the present disclosure, the main body may be partially cut-out ring shaped.

In some exemplary embodiments of the present disclosure, the main body may be partially cut-out polygonal shaped.

According to an exemplary embodiment of the present disclosure, a wireless system having a competitive price may be developed by printing the diplexer on the PCB, and the production time may be shortened because the SMT process for mounting a chip-shaped dielectric diplexer on the PCB is not required any more.

In addition, according to an exemplary embodiment of the present disclosure, it is possible to handle various frequencies and no additional circuit is required. Therefore, the cost may be reduced, the structure may become simpler, and the printing may be facilitated.

DETAILED DESCRIPTION

Various exemplary embodiments will be described more fully hereinafter with reference to the accompanying drawings, in which some exemplary embodiments are shown. The present inventive concept may however, be embodied in many different forms and should not be construed as limited to the exemplary embodiments set forth herein. Rather, the described aspect is intended to embrace all such alterations, modifications, variations, and equivalents that fall within the scope and novel idea of the present disclosure.

Hereinafter, exemplary embodiments of the present disclosure will be described in detail with reference to the accompanying drawings.

Figure 1:
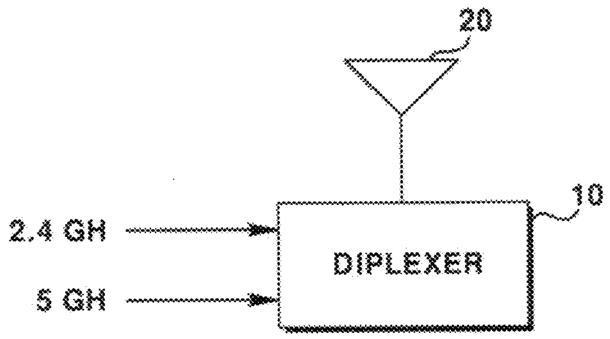
FIG. 1 is a circuit diagram schematically illustrating an example of applying a printed diplexer according to an exemplary embodiment of the present disclosure.

FIG. 1 is a circuit diagram schematically illustrating an example of applying a printed diplexer according to an exemplary embodiment of the present disclosure.

As illustrated in FIG. 1, the diplexer (10) according to an exemplary embodiment of the present disclosure may transmit inputted two signals of 2.4 GHz and 5 GHz to an antenna (20), without influencing each other.

However, although an exemplary embodiment where the diplexer (10) of the present disclosure delivers 2.5 GHz and 5 GHz signals to the antenna (20), the band of signals inputted to the diplexer (10) of the present disclosure is not limited hereto. Therefore, signals in various bands may be inputted to the diplexer. In addition, it is obvious to those skilled in the art that the present disclosure is not limited to two signals inputted, but a plurality of signals inputted may be delivered as a single output.

In addition, although a structure to deliver a signal by diplexing to the antenna (20) is described herein, the present disclosure is not limited hereto. Rather, the signal may be delivered by diplexing to a variety of RF (Radio Frequency) element.

Figure 2:
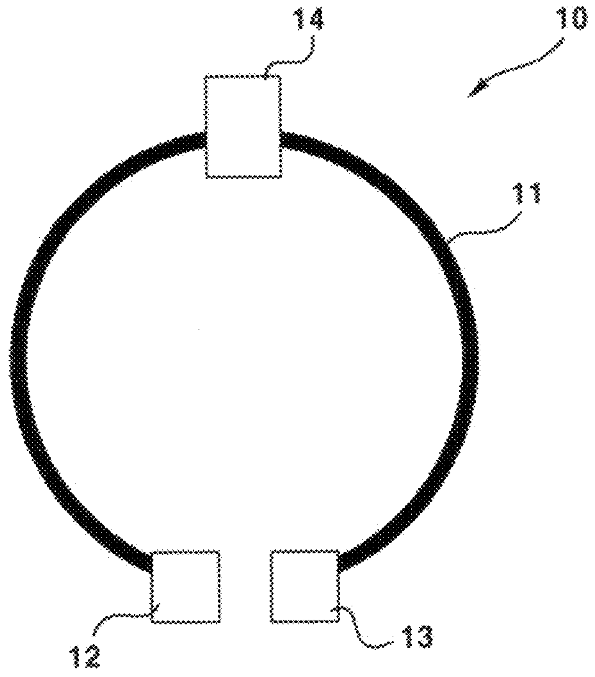
FIG. 2 is a block diagram illustrating a printed diplexer according to an exemplary embodiment of the present disclosure.
Figure 3:
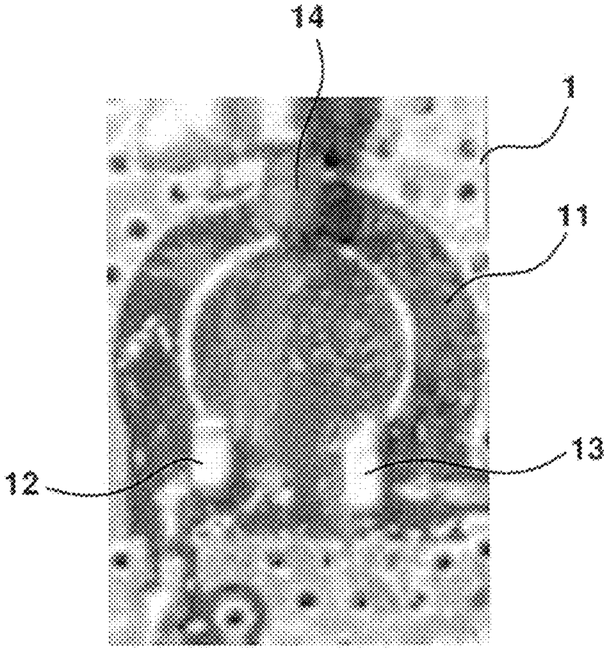
FIG. 3 is a view illustrating an example where a printed diplexer according to an exemplary embodiment of the present disclosure is applied on an actual PCB.

FIG. 2 is a block diagram illustrating a printed diplexer according to an exemplary embodiment of the present disclosure; and FIG. 3 is a view illustrating an example where a printed diplexer according to an exemplary embodiment of the present disclosure is applied on an actual PCB.

As illustrated in FIG. 2, a printed diplexer (10) according to an exemplary embodiment of the present disclosure may include a main body (11), input terminals (12, 13) and an output terminal (14).

The main body (11) may be printed on a PCB (1). An example of a structure printed in a partially cut-out ring shape is described herein.

According to an exemplary embodiment of the present disclosure, the main body (11) may have two input terminals (12, 13) connected to two end portions cut from a partially cut-out ring shape, and may have the output terminal (14) connected at a center portion of the main body (11).

However, the present disclosure is not limited hereto. Rather, the main body (11) may take a partially cut-out polygonal structure.

Figure 5A:
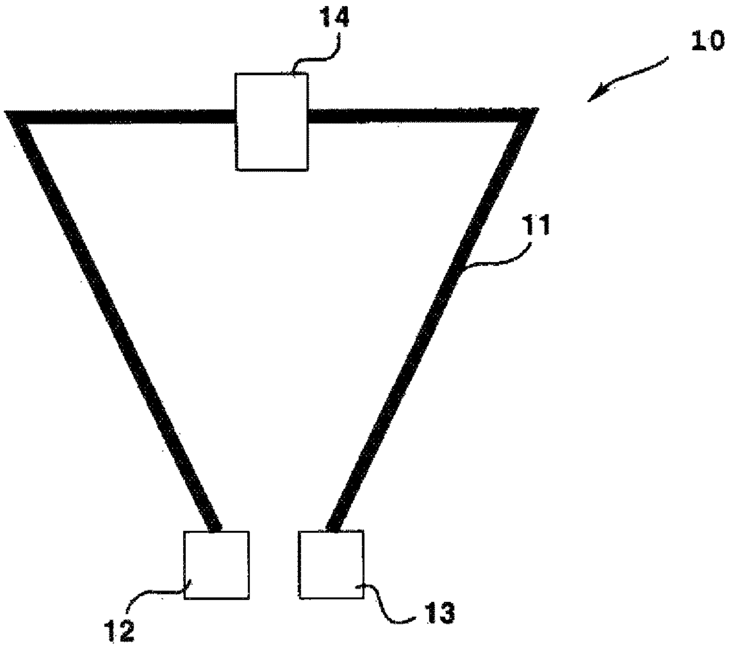
FIGS. 5*a* to 5*c* are exemplary views illustrating a printed diplexer according to an exemplary embodiment of the present disclosure.
Figure 5B:
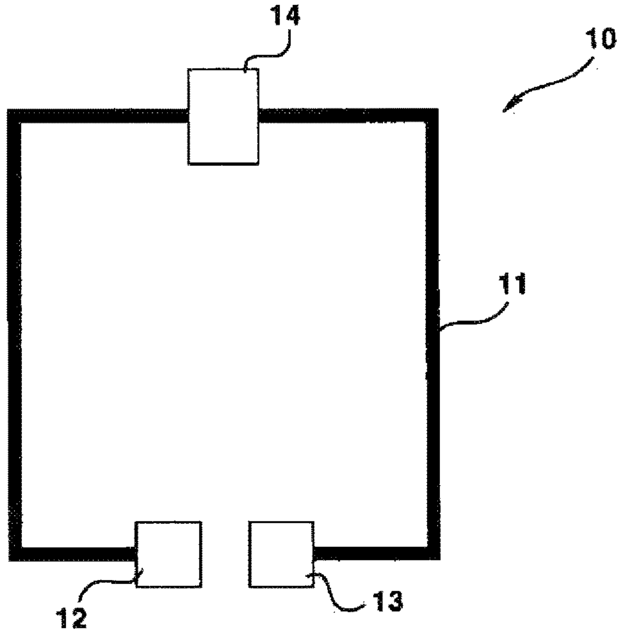
Figure 5C:
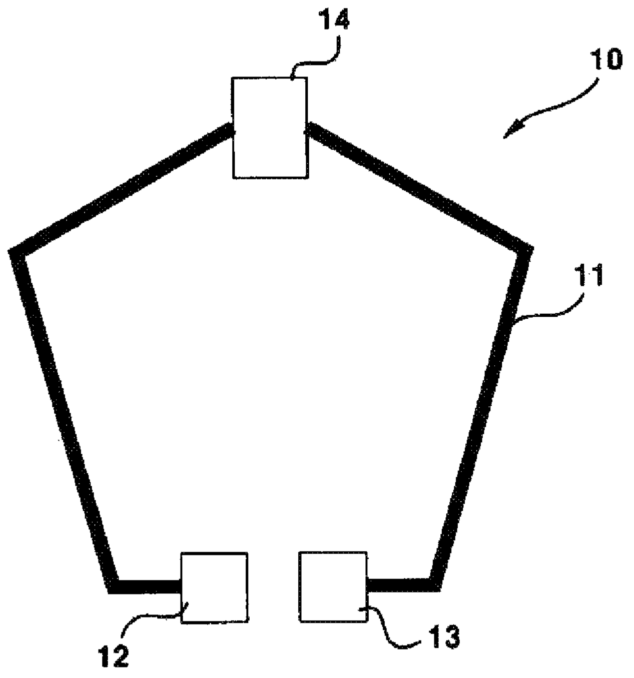

FIGS. 5*a* to 5*c* illustrate a printed diplexer in which the main body (11) has a partially cut out polygonal shape.

The input terminals (12, 13) may be mounted on a surface of the PCB (1) and connected to the main body (11). The input terminals (12, 13) may be formed as an inductor. According to an exemplary embodiment of the present disclosure, two signals may be inputted and outputted as a single signal. However, the present disclosure is not limited hereto. More number of input terminals may be provided when more than two signals are inputted. In addition, in such case, the main body (11) may not be formed in a ring shape, but formed in a more appropriate shape to implement more number of input terminals. Also in such case, a plurality of input terminals may be connected to a plurality of end portions, having the output terminal connected at the center portion.

The input terminals (12, 13) may be an inductor. Here, an inductance of the inductor may be determined by frequency of the signal inputted. Therefore, the printed diplexer (10) of the present disclosure may not be limitedly used to a fixed frequency, but may change frequency of the inputted signals by changing inductance of the inductor that is the input terminal (12, 13).

The output terminal (14) may be mounted on a surface of the PCB (1) and connected to the main body (11). The output terminal (14) may be formed as a capacitor. Here, a capacitance of the capacitor may be determined by frequency of the signal inputted.

Two signals may be inputted through the inductors which are the input terminals (12, 13), and may be outputted through the capacitor that is the output terminal (14) via the ring-shaped main body (11), in the printed diplexer (10) according to an exemplary embodiment of the present disclosure.

Figure 4A:
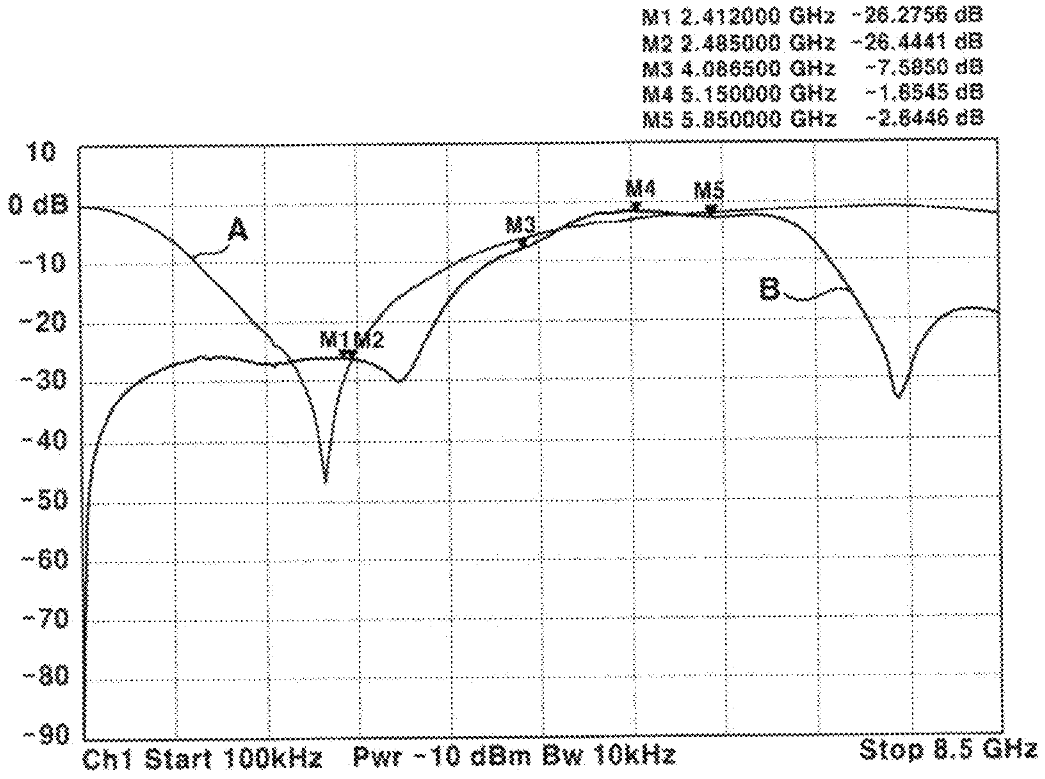
FIGS. 4*a* and 4*b* are exemplary views describing insertion loss of a printed diplexer according to an exemplary embodiment of the present disclosure.
Figure 4B:
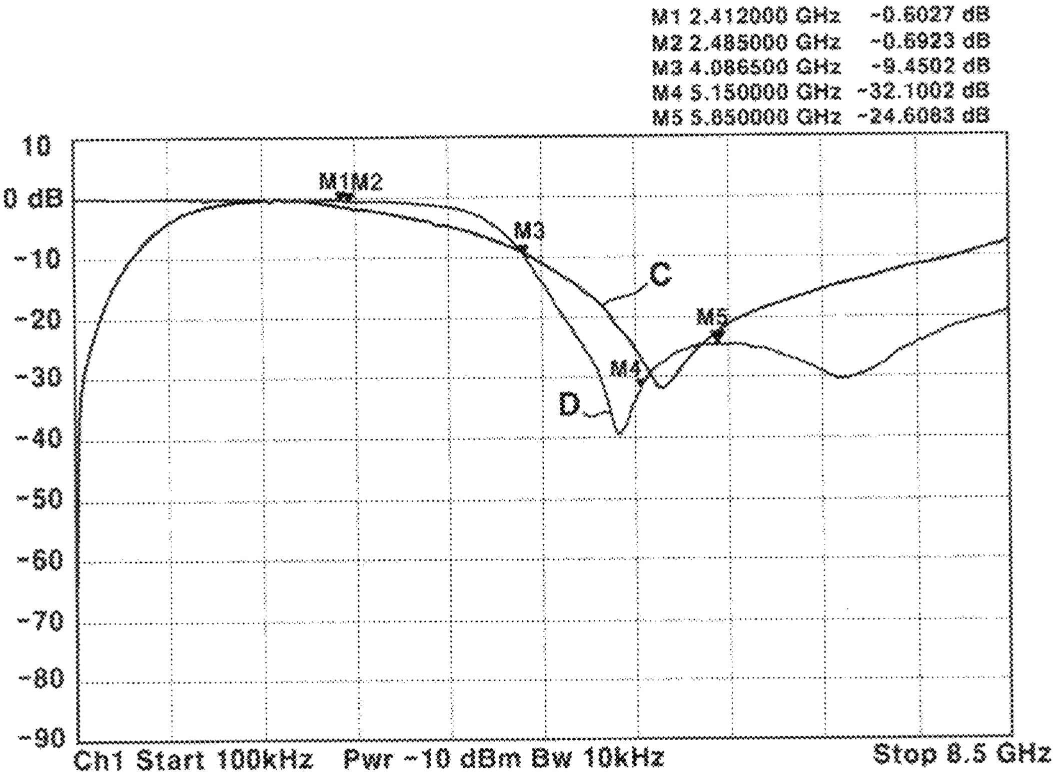

FIGS. 4*a* and 4*b* are exemplary views describing insertion loss of a printed diplexer according to an exemplary embodiment of the present disclosure. FIG. 4*a* illustrates the insertion loss characteristic in 2.4 GHz, and FIG. 4*b* illustrates the insertion loss characteristic in 5 GHz.

As illustrated in FIG. 4*a*, in 2.4 GHz, the insertion loss characteristic (A) (−2.8 dB) of the printed diplexer (10) of the present disclosure is superior to the insertion loss characteristic (B) (−2.6 dB) of the conventional dielectric diplexer. In addition, as illustrated in FIG. 4*b*, in 5 GHz, the insertion loss characteristic (C) (−1.5 dB) of the printed diplexer (10) of the present disclosure is superior to the insertion loss characteristic (D) (−0.7 dB) of the conventional dielectric diplexer.

To summarize, the printed diplexer according to an exemplary embodiment of the present disclosure has advantageous effects as follows:

First, a wireless system having competitive price may be implemented by printing the diplexer on the PCB.

Second, the production time may be shortened, because the SMT process for mounting a chip-shaped dielectric diplexer on the PCB is not required.

Third, the printed diplexer of the present disclosure is capable of handling various frequencies, and thereby requires no additional circuit even when the frequency is changed. Therefore, the cost may be reduced.

Fourth, the printed diplexer of the present disclosure has a very simple structure, and is easy to be printed.

The abovementioned exemplary embodiments are intended to be illustrative, and not to limit the scope of the claims. Many alternatives, modifications, variations, and equivalents will be apparent to those skilled in the art. The features, structures, methods, and other characteristics of the exemplary embodiments described herein may be combined in various ways to obtain additional and/or alternative exemplary embodiments within an equivalent scope. Therefore, the technical scope of the rights for the present disclosure shall be decided by the appended claims and equivalents thereof.

What is claimed is:

1. A printed diplexer comprising:

at least two input terminals mounted on a PCB (Printed Circuit Board);

an output terminal mounted on the PCB; and a main body having the at least two input terminals respectively connected to at least two end portions thereof, having the output terminal connected at a center portion thereof, and configured to output a signal inputted from the at least two input terminals to the output terminal, wherein the main body is printed on the PCB, and wherein the at least two input terminals comprise an inductor, and the output terminal comprises a capacitor.

2. The printed diplexer of claim 1, wherein an inductive reactance of each of the inductors is determined by a frequency of a signal inputted through each of the input terminals.

3. The printed diplexer of claim 1, wherein the main body is partially cut-out ring shaped.

4. The printed diplexer of claim 1, wherein the main body is partially cut-out polygonal shaped.

* * * * *